United States Patent
Cavus et al.

(10) Patent No.: US 9,806,720 B1
(45) Date of Patent: Oct. 31, 2017

(54) COMPOUND SEMICONDUCTOR BASED INVERTER

(71) Applicant: Analog Devices Global, Hamilton (BM)

(72) Inventors: Bilal Tarik Cavus, Istanbul (TR); Ozgun Serttek, Istanbul (TR); Mehmet Bati, Istanbul (TR)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/288,379

(22) Filed: Oct. 7, 2016

(51) Int. Cl.
*H03K 19/20* (2006.01)
*H01L 27/06* (2006.01)
*H03K 19/0948* (2006.01)
*H03K 5/24* (2006.01)

(52) U.S. Cl.
CPC ......... *H03K 19/20* (2013.01); *H01L 27/0605* (2013.01); *H01L 27/0629* (2013.01); *H03K 5/2481* (2013.01); *H03K 19/0948* (2013.01)

(58) Field of Classification Search
CPC ............. H01L 21/8236; H01L 27/0883; H01L 21/8252; H01L 27/0605; H01L 27/11803; H03K 19/09443; H03K 19/09445; H03K 19/09446; H03K 19/09482; H03K 19/09485; H03K 19/09487; H03K 2017/6875; H03K 19/0013; H03K 19/00384; H03K 5/2472
See application file for complete search history.

(56) References Cited

U.S. PATENT DOCUMENTS

| | | | |
|---|---|---|---|
| 4,791,320 A | 12/1988 | Kawata et al. | |
| 4,868,416 A * | 9/1989 | Fitzpatrick | G05F 3/24 323/311 |
| 5,436,499 A * | 7/1995 | Namavar | B82Y 20/00 257/147 |
| 5,663,343 A * | 9/1997 | van der Meij | C07D 471/06 546/72 |
| 7,701,009 B2 * | 4/2010 | Koyama | G09G 3/3688 257/348 |
| 8,436,663 B2 * | 5/2013 | Spits | H03K 19/018521 327/109 |
| 9,099,422 B2 | 8/2015 | Kamada | |
| 2016/0217830 A1 | 7/2016 | Tsubuku et al. | |
| 2016/0218067 A1 | 7/2016 | Masuko et al. | |

FOREIGN PATENT DOCUMENTS

| WO | WO-2016120741 A1 | 8/2016 |
|---|---|---|
| WO | WO-2016123074 A1 | 8/2016 |

OTHER PUBLICATIONS

"Analog Devices Welcomes Hittite Microwave Corporation", (Nov. 2013), 11 pgs.

* cited by examiner

*Primary Examiner* — Vibol Tan
(74) *Attorney, Agent, or Firm* — Schwegman Lundberg & Woessner, P.A.

(57) ABSTRACT

An inverter based on a compound semiconductor uses a depletion mode transistor as the pull-up device, and a current source to bias the pull-up device. The current source is electrically coupled to a source terminal of the pull-up device. As a result, the current source continues to conduct current through the pull-up device, whether the inverter output is high or low, to ensure rapid response of the inverter.

20 Claims, 9 Drawing Sheets under pawned by compound semiconductor substrate. The digital attenuator receives an input signal and outputs an output signal that is an attenuated version of the input signal with an attenuation determined by a plurality of attenuation control signal inputs received by the digital attenuator. The plurality of compound semiconductor inverter circuits have inverter input nodes electrically
COMPOUND SEMICONDUCTOR BASED INVERTER

FIELD OF THE DISCLOSURE

This document pertains generally, but not by way of limitation, to integrated circuits and, and particularly, but not by way of limitation, to inverters integrated with a compound semiconductor.

BACKGROUND

An inverter with a pull-up device and a pull-down device is a core circuit of many digital circuits such as NAND gates, NOR gates, multiplexers, and decoders. Silicon CMOS technology combines an NMOS device with a PMOS device as an efficient pull-up device.

Compound semiconductor technology lacks a complementary PMOS device. Consequently, with compound semiconductors, the pull-up device is implemented with a resistor or a depletion mode device. In examples where the pull-up device is implemented with a depletion mode device, a current source is coupled to the gate of the depletion mode device and to the source of the enhancement mode pull-down device.

SUMMARY OF THE DISCLOSURE

It would be desirable to implement an inverter integrated with a compound semiconductor having improved efficiency. An inverter based on a compound semiconductor uses a depletion mode transistor as the pull-up device, and a current source to bias the pull-up device. The current source is electrically coupled to a source terminal of the pull-up device. As a result, the current source continues to conduct current through the pull-up device, whether the inverter output is high or low, to ensure rapid response of the inverter.

Various examples are directed to circuits and methods for a compound semiconductor based inverter.

In certain examples of a compound semiconductor inverter circuit, the circuit comprises a pull-down FET, a depletion mode pull-up FET, a bias current source, and a voltage drop circuit, all integrated with a compound semiconductor substrate. The bias current source is electrically connected to a source terminal of the depletion mode pull-up FET to keep the depletion mode pull-up FET on. The voltage drop circuit is electrically coupled between the source terminal of the depletion mode pull-up FET and a gate terminal of the depletion mode pull-up FET. The voltage drop circuit is electrically coupled to a drain terminal of the pull-down FET to maintain a source-gate bias voltage between the source and gate terminals of the depletion mode pull-up FET to keep the depletion mode pull-up FET on at least when the pull-down FET is turned on and sinking current through the voltage drop circuit.

In certain examples, a device is provided that discloses a circuit package with a plurality of attenuation input leads, a digital attenuator in the circuit package, and a plurality of compound semiconductor inverter circuits in the circuit package and integrated with a compound semiconductor substrate. The digital attenuator receives an input signal and outputs an output signal that is an attenuated version of the input signal with an attenuation determined by a plurality of attenuation control signal inputs received by the digital attenuator. The plurality of compound semiconductor inverter circuits have inverter input nodes electrically coupled to the plurality of attenuation input leads, and the plurality of compound semiconductor inverter circuits have inverter output nodes electrically coupled to the plurality of attenuation control signal inputs.

In certain examples, a method is disclosed of inverting an input signal using a compound semiconductor inverter circuit including a depletion mode pull-up FET and a pull-down FET. The method includes, responsive to an inverter input node receiving a logic high input voltage, turning on a pull-down FET and providing a logic low output voltage equal to a magnitude of a turn-on threshold voltage of the depletion mode pull-up FET while biasing the depletion mode pull-up FET on via a pull-up FET bias current and a pull-up FET gate-source bias circuit. The method includes, responsive to the inverter input node receiving a logic low input voltage, turning off the pull-down FET and providing a logic high output voltage equal to an upper supply voltage applied to the inverter circuit.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Compound semiconductor technology lacks a complementary PMOS device for an inverter, unlike CMOS silicon technology which uses complementary PMOS and NMOS devices for an inverter. As a substitute for the missing complementary PMOS device, an inverter based on a compound semiconductor uses a depletion mode transistor as the pull-up device. A compound semiconductor based inverter has a long settling time even with a current source. However, by electrically connecting the current source to the source terminal of the pull-up device, the settling time of the inverter is shortened. Also, power consumption is reduced because of lower on mode current.

Figure 1:
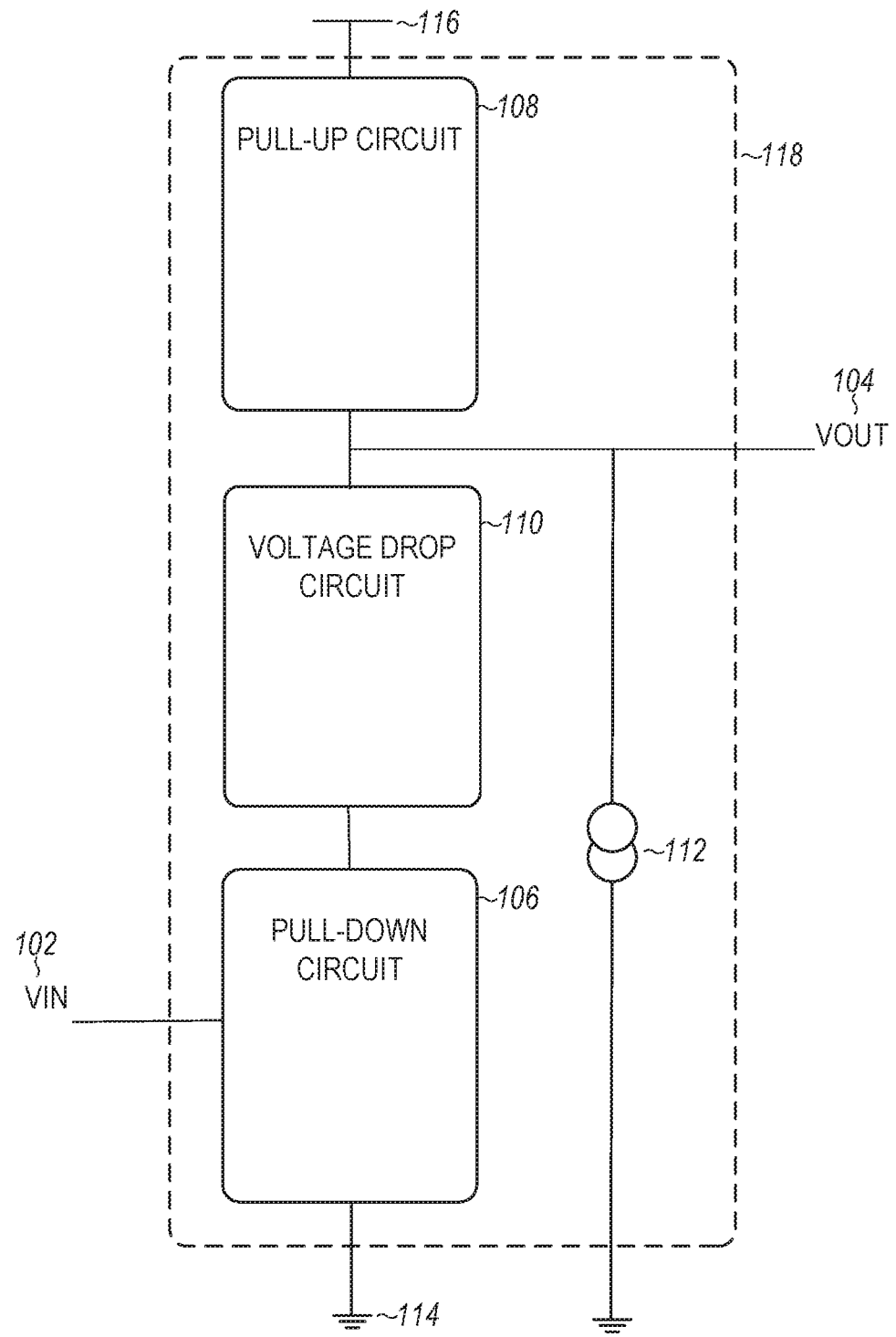
FIG. 1 is a diagram showing a general example of a compound semiconductor inverter circuit.

FIG. 1 is a diagram showing a general example of a compound semiconductor inverter circuit with input VIN 102 and output VOUT 104. The compound semiconductor inverter circuit includes upper supply voltage 116 and lower supply voltage 114. Pull-up circuit 108, voltage drop circuit 110, and pull-down circuit 106 are coupled in series in between upper supply voltage 116 and lower supply voltage 114. Pull-down circuit 106 is controlled by VIN 102. VOUT 104 is connected electrically in between pull-up circuit 108 and voltage drop circuit 110. Current source 112 is electrically coupled between VOUT 104 and lower supply voltage 114.

The inverter circuit is integrated with a compound semiconductor substrate. Compound semiconductors are composed of at least two different elements when undoped. Some general types of compound semiconductors are III-V compound semiconductors and II-VI compound semiconductors. Particular examples of compound semiconductors include SiC, BN, BP, BAs, AlN, AlP, AlAs, AlSb, GaN, GaP, GaAs, GaSb, InN, InP, InAs, InSb, CdSe, CdS, CdTe, ZnO, ZnSe, ZnS, ZnTe, CuCl, CuS, PbSe, PbS, PbTe, SnS, SnTe, PbSnTe, TlSnTe, TlGeTe, BiTe, CdP, CdAs, CdSb, ZnP, ZnAs, ZnSb, TiO, CuO, UO, BiO, SnO, BaTiO, SrTiO, LiNbO, LaCuO, PbI, MoS, GaSe, SnS, BiS, GaMnAs, InMnAs, CdMnTe, PbMnTe, LaCaMnO, FeO, NiO, EuO, EuS, CrBr, CuInSe, AgGaS, ZnSiP, AsS, PtSi, BiI, HgI, TlBr, AgS, FeS, CuZnSnS, CuZnSbS, CuSnS, SiGe, SiSn, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb, GaInAsSbP, CdZnTe, HgCdTe, HgZnTe, HgZnSe, and CuInGaSe. Various embodiments have any value within a range of available stoichiometries.

The compound semiconductor inverter circuit receives a logic low voltage at VIN 102 and outputs a logic high voltage at VOUT 104; and receives a logic high voltage at VIN 102 and outputs a logic low voltage at VOUT 104. When VOUT 104 outputs a logic high voltage, pull-up circuit 108 is pulling up the output voltage towards upper supply voltage 116. When VOUT 104 outputs a logic low voltage, pull-down circuit 106 is pulling down the output voltage towards lower supply voltage 114. Voltage drop circuit 110 causes a voltage drop between pull-up circuit 108 and pull-down circuit 106.

Figure 2:
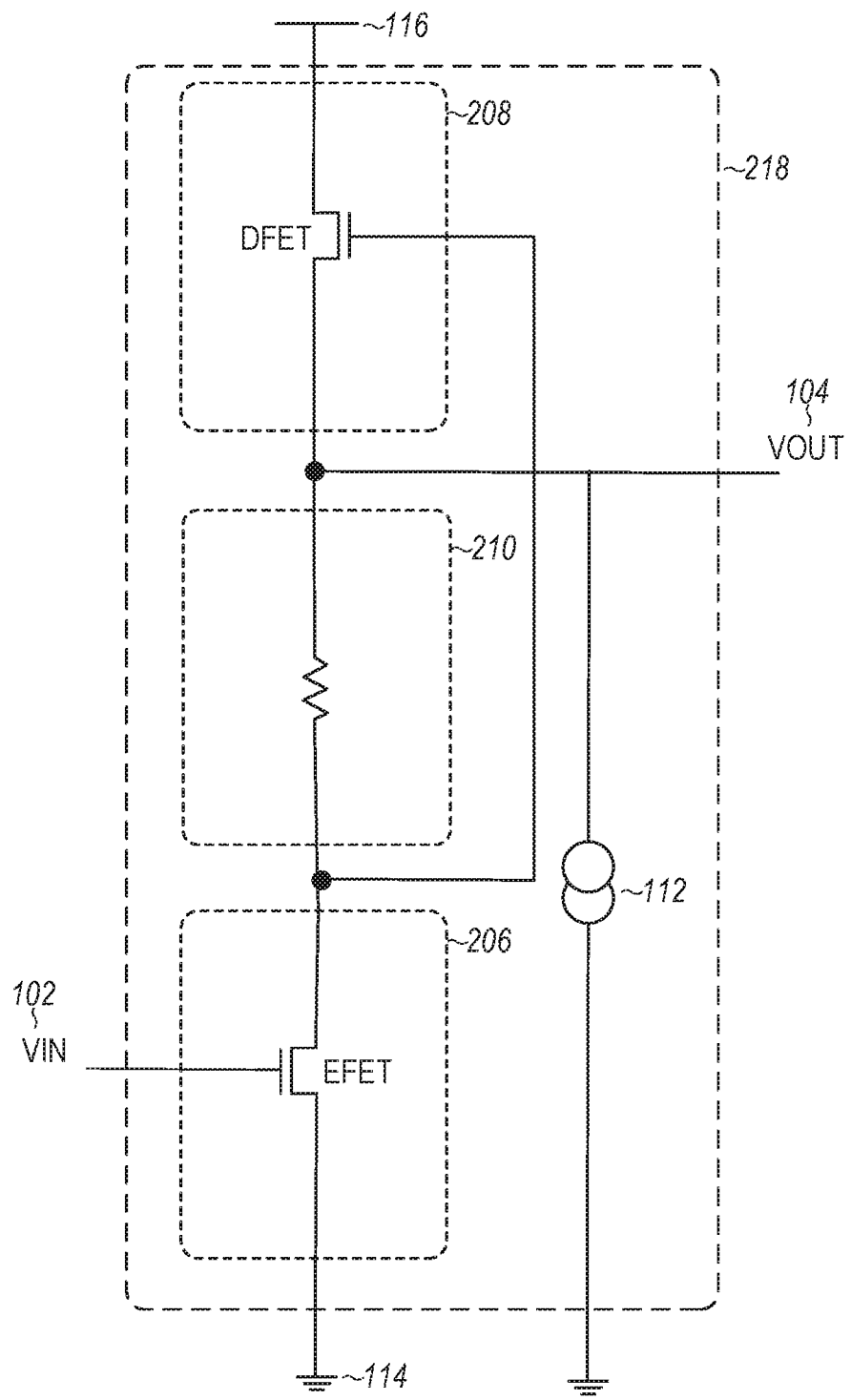
FIGS. 2-3 are diagrams showing particular examples of the compound semiconductor inverter circuit of FIG. 1.
Figure 3:
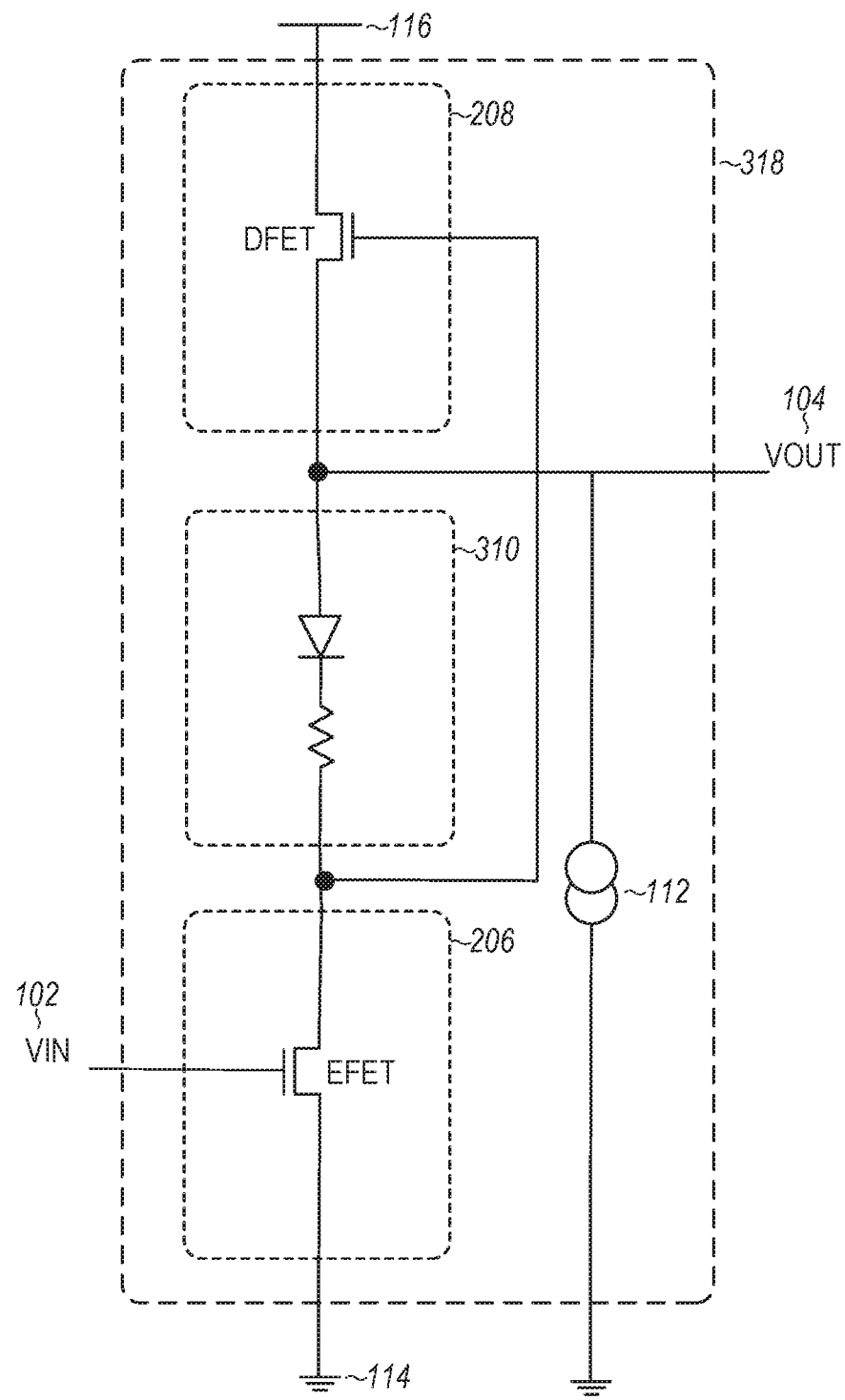

FIGS. 2-3 are diagrams showing particular examples of the compound semiconductor inverter circuit of FIG. 1. In FIG. 2. the pull-up circuit is depletion-mode field effect transistor (DFET) 208, the voltage drop circuit is resistor 210, and the pull-down circuit is enhancement-mode field effect transistor (EFET) 206. The gate of DFET 208 is electrically coupled to the node in between resistor 210 and EFET 206. Resistor 210 is electrically coupled in between the source of DFET 208 and the drain of EFET 206. Resistor 210 maintains a source-gate bias voltage between the source and gate terminals of DFET 208 to keep then DFET 208 when at least when EFET 206 is turned on and sinking current through resistor 210. Current source 112 and output VOUT 104 are electrically connected to the source of DFET 208. Current source 112 keeps DFET 208 on. In one embodiment of the compound semiconductor inverter circuit of FIG. 2, the on mode current is about 5 uA, the output voltage for logic high is the upper supply voltage, the output voltage for logic low is the absolute value of the negative threshold voltage of DFET 208, and the settling time is about a few ns.

FIG. 3 is similar to FIG. 2. However, the voltage drop circuit is a series coupled diode and resistor. In one embodiment of the compound semiconductor inverter circuit of FIG. 3, the on mode current is about 5 uA, the output voltage for logic high is the upper supply voltage, the output voltage for logic low is the absolute value of the negative threshold voltage of DFET 208, and the settling time is about 50 ns.

In other embodiments, the pull-up circuit is an EFET, but then the output voltage for logic high is limited to less than the upper supply voltage by the threshold voltage of the EFET.

In other embodiments, the voltage drop circuit includes one or more diodes without any resistors, but then the current is high especially when input 102 is high.

Figure 4:
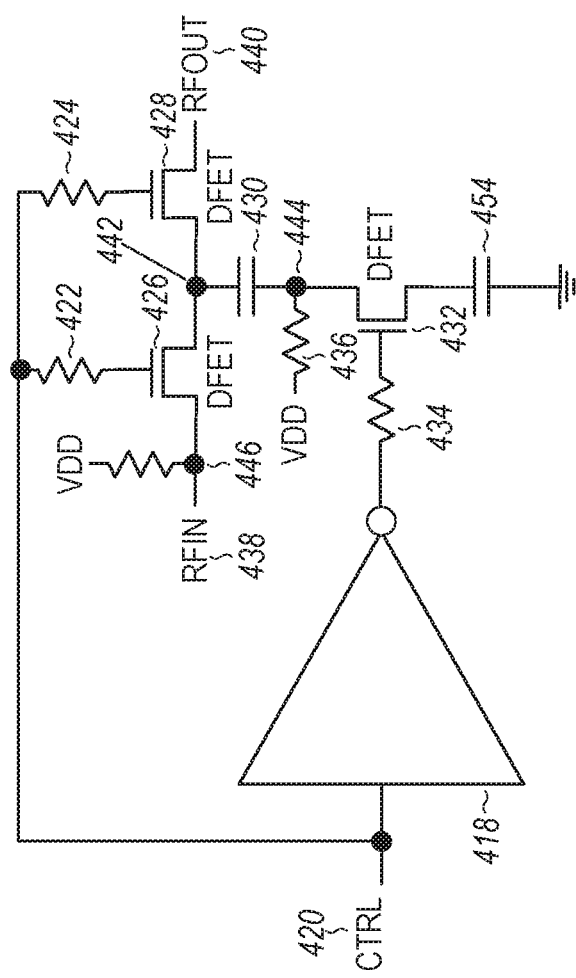
FIG. 4 is a diagram showing a general example of a switch with a compound semiconductor inverter circuit.

FIG. 4 is a diagram showing a general example of a switch with a compound semiconductor inverter circuit. Inverter 418 is a compound semiconductor inverter such as one shown in FIGS. 1-3. Inverter 418 has an input coupled to CTRL signal 420. Inverter 418 has an output electrically coupled, via resistor 434, to the gate of DFET 432. DFET 432 has a source electrically coupled via capacitor 454 to a lower supply voltage of ground. DFET 432 has a drain electrically coupled via resistor 436 to an upper supply voltage of VDD, and via capacitor 430 to node 442.

The switch controls a channel in between RFIN 438 and RFOUT 440. RFIN 438 and RFOUT 440 are electrically coupled by the series coupled elements: node 446 coupled via a resistor to the upper supply voltage of VDD, DFET 426, node 442, and DFET 428. CTRL signal 420 is electrically coupled to the gate of DFET 426 via resistor 422, and to the gate of DFET 428 via resistor 424.

When the input CTRL 420 is a logic low voltage, DFETs 426 and 428 turn off the channel in between RFIN 438 and RFOUT 440. Inverter 418 receives logic low voltage and outputs logic high voltage. The logic high voltage that is output from inverter 418 turns on DFET 432 and turns on the shunt to lower the voltage at node 442.

When the input CTRL 420 is a logic high voltage, DFETs 426 and 428 turn on the channel in between RFIN 438 and RFOUT 440. Inverter 418 receives logic high voltage and outputs logic low voltage. The logic low voltage that is output from inverter 418 turns off DFET 432 and turns off the shunt to decouple the shunt from node 442.

Figure 5:
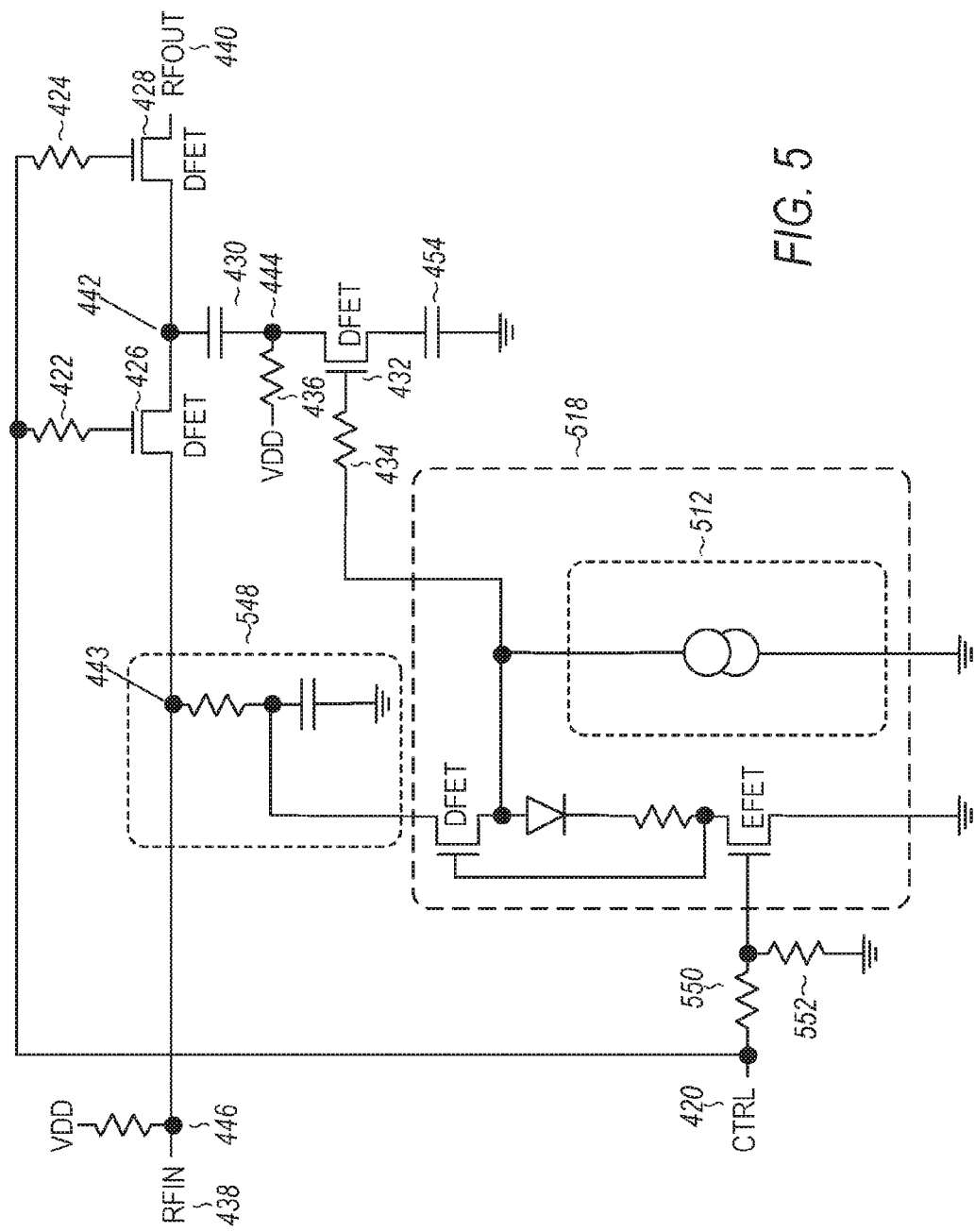
FIGS. 5-6 are diagrams showing particular examples of the switch with a compound semiconductor inverter circuit of FIG. 4.
Figure 6:
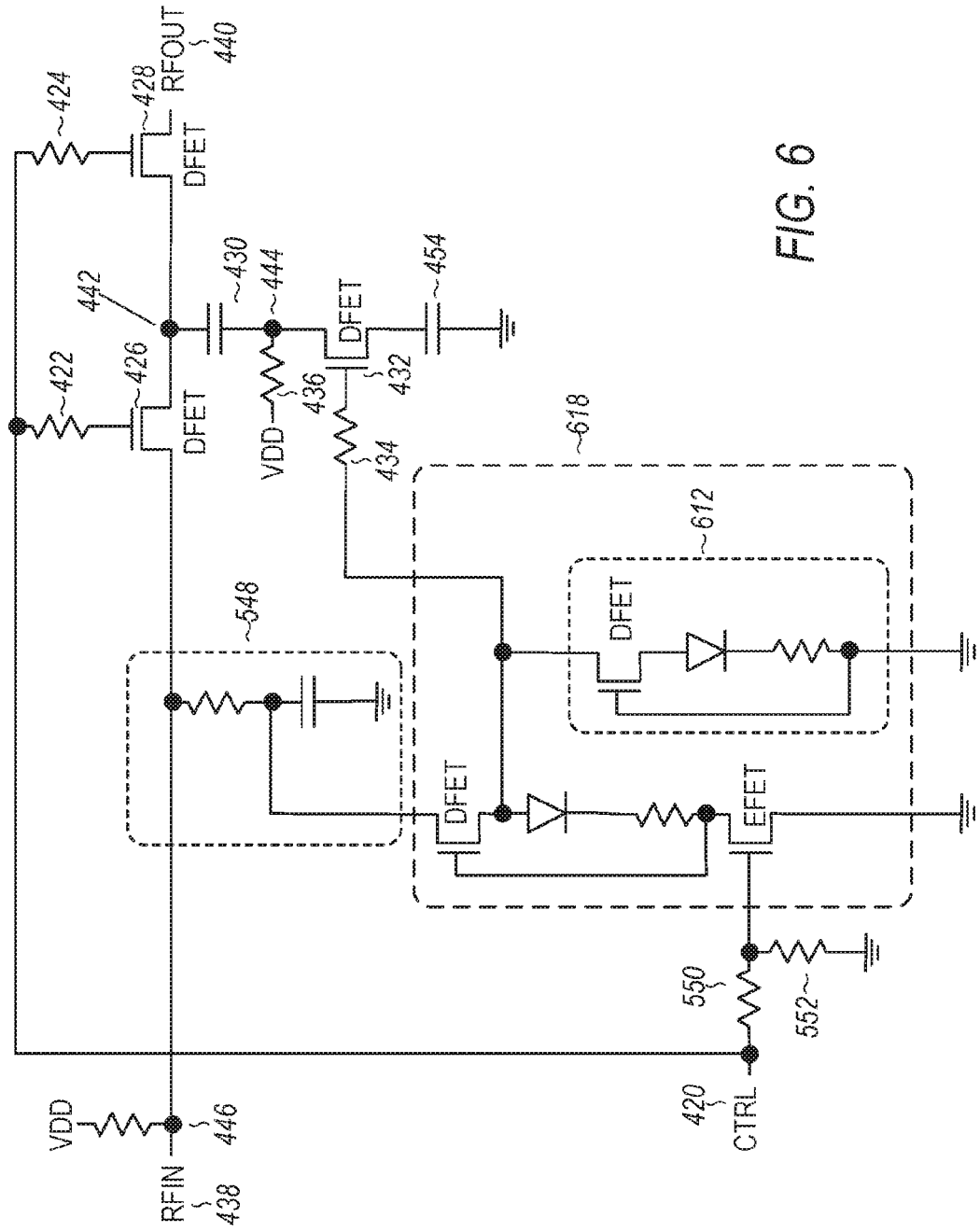

FIGS. 5-6 are diagrams showing particular examples of the switch with a compound semiconductor inverter circuit of FIG. 4.

FIG. 5 is similar to FIG. 4. FIG. 5 inverter 518 in place of inverter 418 in FIG. 4. Inverter 518 is the same as the compound semiconductor inverter in FIG. 2 and includes current source 512.

Circuit 548 is the upper supply voltage of inverter 518. Circuit 548 includes a resistor electrically coupling node 443 to the drain of the pull-up DFET in inverter 518. Circuit 548 also includes a capacitor electrically AC coupling the drain of the pull-up DFET in inverter 518 to the lower supply voltage of ground.

CTRL 420 is electrically coupled to the input of inverter 518 via resistor 550. The input of inverter 518 is electrically coupled to the lower supply voltage of ground via resistor 552.

FIG. 6 is similar to FIG. 5. However, in FIG. 6 current source 612 takes the place of current source 512 in FIG. 5. Current source 612 includes a series connected DFET, diode, and resistor. The gate of the DFET is electrically coupled to the far terminal of the resistor.

Figure 7:
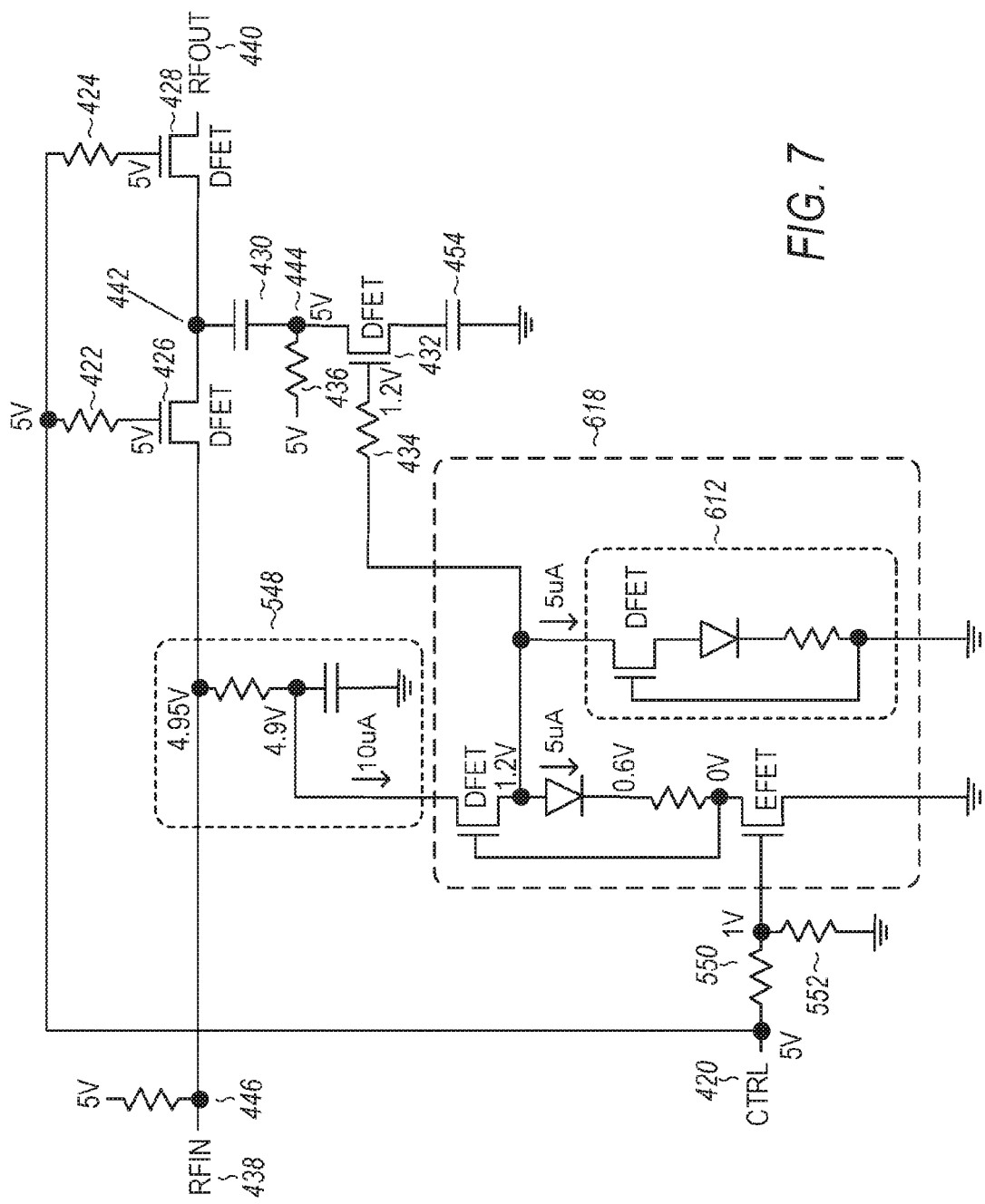
FIGS. 7-8 are diagrams showing example operating points of the switch with a compound semiconductor inverter circuit of FIG. 6.
Figure 8:
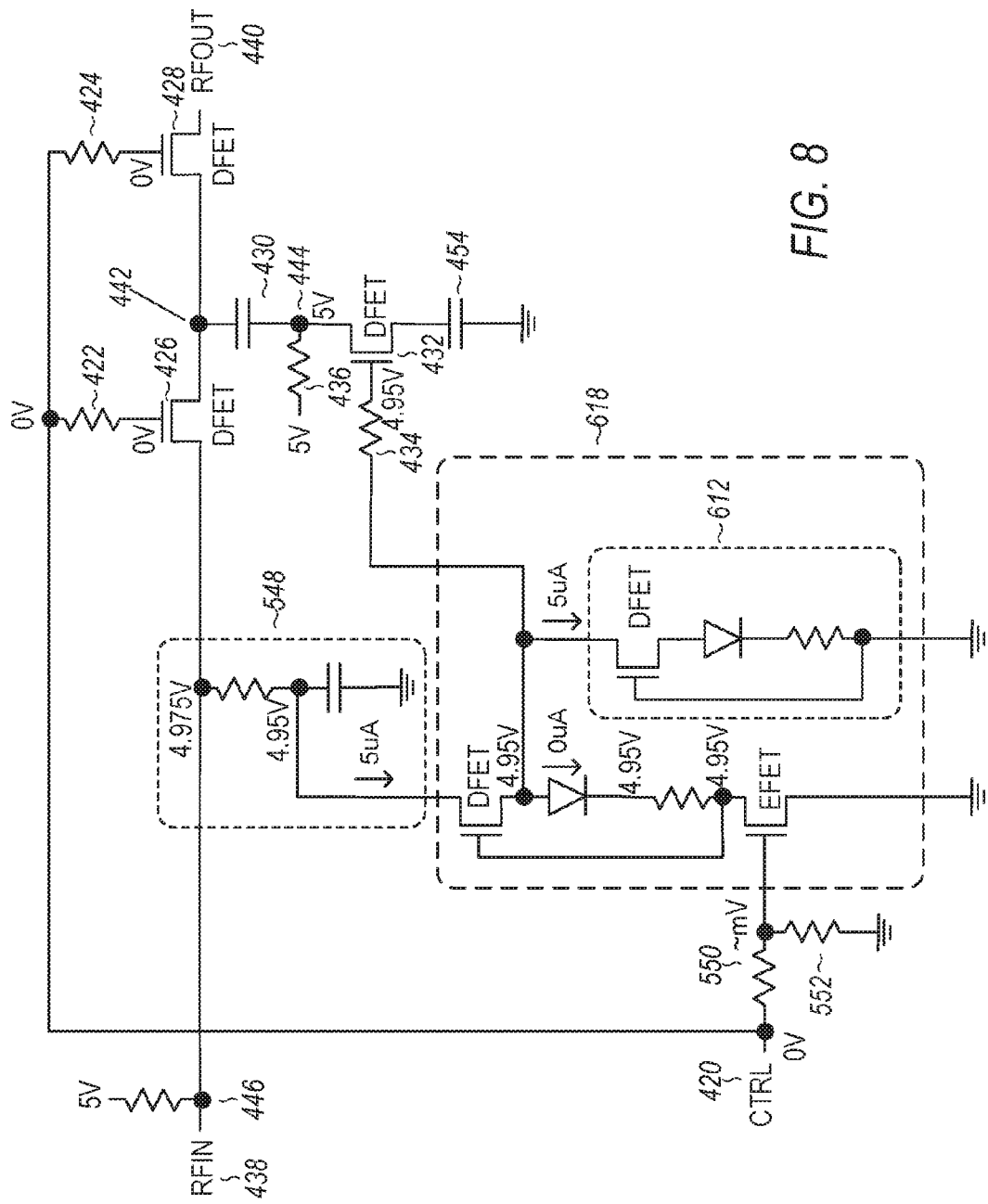

FIGS. 7-8 are diagrams showing example operating points of the switch with a compound semiconductor inverter circuit of FIG. 6. In these examples, the DFET has a negative threshold voltage Vth of −1.2V. So if the source has a voltage of about 5V, then the DFET is on when the gate voltage VG is at least about 3.8V, because VG−VS=VGS and VGS>=Vth. Other embodiments have different threshold voltages, supply voltages, and turn on voltages for the gate.

In FIG. 7, the input CTRL 420 is logic high of 5V. The logic high input CTRL 420 turns on the channel between RFIN and RFOUT. The logic high input CTRL 420 is received by inverter 618. Inverter 618 outputs a logic low value of 1.2V. The logic low value of 1.2V turns off DFET 432 and turns off the shunt to node 442. Inverter 618 receives 10 uA of current from upper supply voltage 548. Within inverter 618, 10 uA of current flows through the DFET. The 10 uA of current divides between 5 uA of current through the series diode and resistor, and 5 uA of current through current source 612.

In FIG. 8, the input CTRL 420 is logic low of 0V. The logic low input CTRL 420 turns off the channel between RFIN and RFOUT. The logic low input CTRL 420 is received by inverter 618. Inverter 618 outputs a logic high value of 4.95V. The logic high value of 4.95V turns on DFET 432 and turns on the shunt to node 442. Inverter 618 receives 5 uA of current from upper supply voltage 548. Within inverter 618, 5 uA of current flows through the DFET. The 5 uA of current flows through current source 612, and no current flows through the series diode and resistor.

Figure 9:
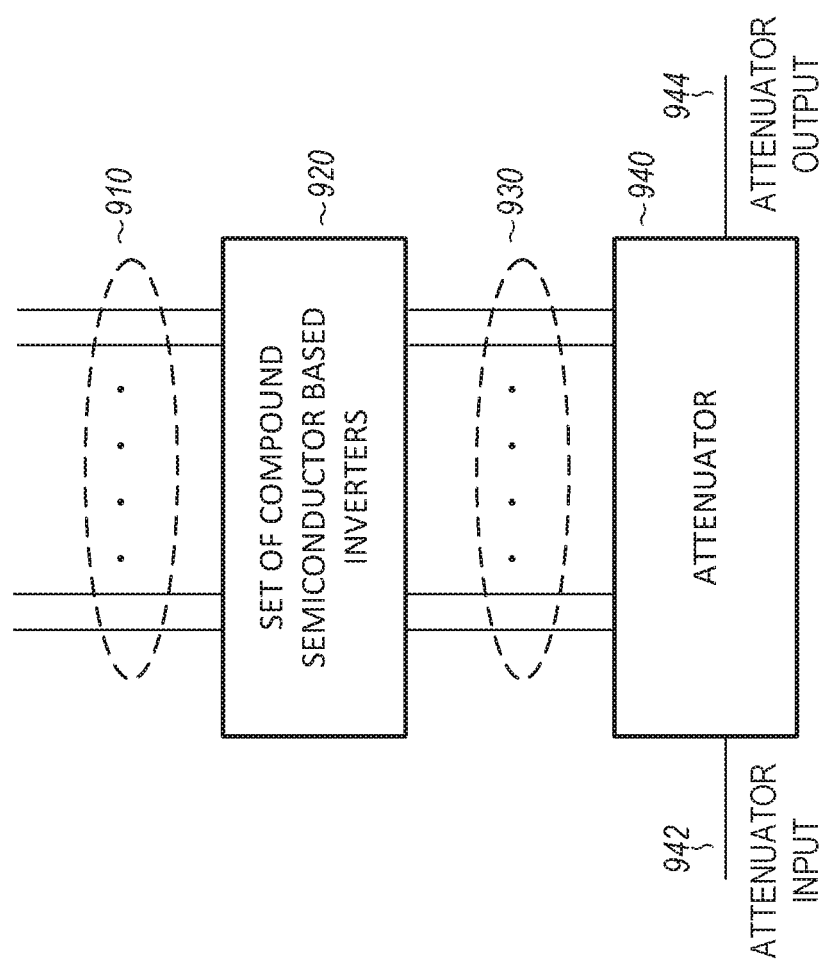
FIG. 9 is a diagram showing a block diagram of an example attenuator with a set of compound semiconductor inverter circuits.

FIG. 9 is a diagram showing a block diagram of an example attenuator with a set of compound semiconductor inverter circuits. Inputs 910 are received by the set of compound semiconductor inverters 920. Examples of the set of compound semiconductor inverters 920 are shown in FIGS. 1-8. Inverter outputs 930 of the set of compound semiconductor inverters 920 carry inverted versions of the signals on inputs 910. The attenuator 940 has attenuator input 942 and attenuator output 944. The magnitude of attenuation between attenuator input 942 and attenuator output 944 is controlled by inverter outputs 930. Different lines of the inverter outputs 930 indicate different amounts of attenuation.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A compound semiconductor inverter circuit, comprising:

a pull-down FET, integrated with a compound semiconductor substrate;

a depletion mode pull-up FET, integrated with the compound semiconductor substrate;

a bias current source, integrated with the compound semiconductor substrate, the bias current source electrically connected to a source terminal of the depletion mode pull-up FET to keep the depletion mode pull-up FET on by providing a bias current when the pull-down FET is off; and a voltage drop circuit, electrically coupled between the source terminal of the depletion mode pull-up FET and a gate terminal of the depletion mode pull-up FET, and electrically coupled to a drain terminal of the pull-down FET to maintain a source-gate bias voltage between the source and gate terminals of the depletion mode pull-up FET to keep the depletion mode pull-up FET on at least when the pull-down FET is turned on and sinking current through the voltage drop circuit.

2. The compound semiconductor inverter circuit of claim 1, wherein the pull-down FET is an enhancement mode pull-down FET.

3. The compound semiconductor inverter circuit of claim 1, wherein the pull-down FET is a depletion mode pull-down FET.

4. The compound semiconductor inverter circuit of claim 1, wherein the voltage drop circuit comprises:
a diode integrated with the compound semiconductor substrate.

5. The compound semiconductor inverter circuit of claim 1, wherein the voltage drop circuit comprises:
a resistor integrated with the compound semiconductor substrate.

6. The compound semiconductor inverter circuit of claim 1, wherein the compound semiconductor substrate is a III-V compound based semiconductor substrate.

7. The compound semiconductor inverter circuit of claim 1, wherein
the compound semiconductor inverter circuit has an input node coupled to a gate terminal of the pull-down FET, and an output node coupled to the source terminal of the depletion mode pull-up FET,
wherein responsive to the input node receiving a logic low input voltage, the output node provides a logic high output voltage equal to an upper supply voltage applied to the inverter circuit with the bias current circuit providing a bias current to keep the depletion mode pull-up FET on while the pull-down FET is off, and
wherein responsive to the input node receiving a logic high input voltage, the output node provides a logic low output voltage equal to a magnitude of a turn-on threshold voltage of the depletion mode pull-up FET.

8. The compound semiconductor inverter circuit of claim 1,
wherein the compound semiconductor inverter circuit has an input node coupled to a gate terminal of the pull-down FET, and an output node coupled to the source terminal of the depletion mode pull-down FET,
wherein responsive to the input node receiving an input change between a logic low input voltage and a logic high input voltage, the output node provides an output change between a high output voltage and a logic low output voltage with a settling time between about 50 ns and 80 ns.

9. The compound semiconductor inverter circuit of claim 1, wherein
at least one of the pull-down FET and the depletion mode pull-up FET has an on-mode current of about 5 microamperes.

10. A device, comprising:
a circuit package with a plurality of attenuation input leads;
a digital attenuator in the circuit package that receives an input signal and outputs an output signal that is an attenuated version of the input signal with an attenuation determined by a plurality of attenuation control signal inputs received by the digital attenuator;
a plurality of compound semiconductor inverter circuits in the circuit package and integrated with a compound semiconductor substrate, each compound semiconductor inverter circuit of the plurality of compound semiconductor inverter circuits including:
a pull-down FET, integrated with the compound semiconductor substrate;
a depletion mode pull-up FET, integrated with the compound semiconductor substrate;
a bias current source, integrated with the compound semiconductor substrate, the bias current source electrically connected to a source terminal of the depletion mode pull-up FET to keep the depletion mode pull-up FET on; and
a voltage drop circuit, electrically coupled between the source terminal of the depletion mode pull-up FET and a gate terminal of the depletion mode pull-up FET, and electrically coupled to a drain terminal of the pull-down FET to maintain a source-gate bias voltage between the source and gate terminals of the depletion mode FET to keep the depletion mode pull-up FET on at least when the pull-down FET is turned on and sinking current through the voltage drop circuit,
wherein the plurality of compound semiconductor inverter circuits have inverter input nodes electrically coupled to the plurality of attenuation input leads, and the plurality of compound semiconductor inverter circuits have inverter output nodes electrically coupled to the plurality of attenuation control signal inputs.

11. The device of claim 10, wherein the pull-down FET of at least one of the plurality of compound semiconductor inverter circuits is an enhancement mode pull-down FET.

12. The device of claim 10, wherein the pull-down FET of at least one of the plurality of compound semiconductor inverter circuits is a depletion mode pull-down FET.

13. The device of claim 10, wherein the voltage drop circuit of at least one of the plurality of compound semiconductor inverter circuits comprises:
a diode integrated with the compound semiconductor substrate.

14. The device of claim 10, wherein the voltage drop circuit of at least one of the plurality of compound semiconductor inverter circuits comprises:
a resistor integrated with the compound semiconductor substrate.

15. The device of claim 10, wherein the compound semiconductor substrate is a III-V compound based semiconductor substrate.

16. The device of claim 10,
wherein at least one of the plurality of compound semiconductor inverter circuits has an input node coupled to a gate terminal of the pull-down FET, and an output node coupled to the source terminal of the depletion mode pull-up FET, wherein responsive to the input node receiving a logic low input voltage, the output node provides a logic high output voltage equal to an upper supply voltage applied to the inverter circuit, and wherein responsive to the input node receiving a logic high input voltage, the output node provides a logic low output voltage equal to a magnitude of a turn-on threshold voltage of the pull-up FET.

17. The device of claim 10, wherein at least one of the plurality of compound semiconductor inverter circuits has an input node coupled to a gate terminal of the pull-down FET, and an output node coupled to the source terminal of the depletion mode pull-up FET, wherein responsive to the input node receiving an input change between a logic low input voltage and a logic high input voltage, the output node provides an output change between a high output voltage and a logic low output voltage with a settling time between about 50 ns and 80 ns.

18. The device of claim 10, wherein for at least one of the plurality of compound semiconductor inverter circuits, the pull-down FET and the depletion mode pull-up FET has an on-mode current of about 5 microamperes.

19. A method of inverting an input signal using a compound semiconductor inverter circuit including a depletion mode pull-up FET and a pull-down FET, the method comprising:

responsive to an inverter input node receiving a logic high input voltage, turning on a pull-down FET and providing a logic low output voltage equal to a magnitude of a turn-on threshold voltage of the depletion mode pull-up FET while biasing the depletion mode pull-up FET on via a pull-up FET bias current and a pull-up FET gate-source bias circuit; and responsive to the inverter input node receiving a logic low input voltage, turning off the pull-down FET and providing a logic high output voltage equal to an upper supply voltage applied to the inverter circuit while continuing to provide the pull-up FET bias current when the pull-down FET is off.

20. The method of claim 19, wherein the compound semiconductor inverter circuit has an input node coupled to a gate terminal of the pull-down FET, and an output node coupled to the source terminal of the depletion mode pull-up FET, wherein responsive to the input node receiving an input change between the logic low input voltage and the logic high input voltage, the output node provides an output change between the high output voltage and the logic low output voltage with a settling time between about 50 ns and 80 ns.

* * * * *